(12) United States Patent
Venkadari Yogendra et al.

(10) Patent No.: US 11,984,686 B2
(45) Date of Patent: May 14, 2024

(54) HF TERMINAL FOR AN HF CONNECTOR, AND A METHOD FOR IMPROVING THE QUALITY OF A SIGNAL INTEGRITY OF A MALE HF CONNECTOR OR OF AN HF PLUG-IN CONNECTOR

(71) Applicant: TE Connectivity Germany GmbH, Bensheim (DE)

(72) Inventors: Deeksha Venkadari Yogendra, Bensheim (DE); Daniel Volkmann, Bensheim (DE); Gregor Karrasch, Bensheim (DE)

(73) Assignee: TE Connectivity Germany GmbH, Bensheim (DE)

( * ) Notice: Subject to any disclaimer, the term of this patent is extended or adjusted under 35 U.S.C. 154(b) by 64 days.

(21) Appl. No.: 17/096,067

(22) Filed: Nov. 12, 2020

(65) Prior Publication Data
US 2021/0151937 A1 May 20, 2021

(30) Foreign Application Priority Data
Nov. 14, 2019 (DE) .......................... 102019130743.0

(51) Int. Cl.
*H01R 13/6474* (2011.01)
*G06F 30/20* (2020.01)
(Continued)

(52) U.S. Cl.
CPC ......... *H01R 13/6474* (2013.01); *H01R 13/04* (2013.01); *H01R 24/44* (2013.01); *G06F 30/20* (2020.01); *H01R 2103/00* (2013.01)

(58) Field of Classification Search
CPC .... H01R 2103/00; H01R 9/05; H01R 9/0503; H01R 9/0515; H01R 13/6474; H01R 13/04; G06F 30/20
(Continued)

(56) References Cited

U.S. PATENT DOCUMENTS 2,688,737 A * 9/1954 Oskerka, Jr. ......... H01R 13/521
174/50.57
3,290,639 A * 12/1966 Driemeyer ........... H01R 13/523
439/589
(Continued)

FOREIGN PATENT DOCUMENTS

DE 1795755 U 9/1959
EP 0380892 A1 8/1990

OTHER PUBLICATIONS

European Patent Office, dated Mar. 15, 2021, 16 pages.
European Patent Office Communication, dated May 4, 2023, corresponding to Application No. 20 207 222.9-1201, 11 pages.

*Primary Examiner* — Gary F Paumen
(74) *Attorney, Agent, or Firm* — Barley Snyder

(57) ABSTRACT

A high frequency (HF) terminal for an HF connector includes an electromechanical contact section, a mechanical fastening section, an electromechanical connection section, and an HF compensation region apart from the electromechanical contact section. The HF compensation region is geometrically developed in such a way that a loss in a signal integrity of an HF plug-in connector including the HF connector with the HF terminal and an HF mating connector with an HF mating terminal in a final plugged-in position can be at least partially compensated by the HF compensation region.

20 Claims, 11 Drawing Sheets

(51) Int. Cl.
*H01R 13/04* (2006.01)
*H01R 24/44* (2011.01)
*H01R 103/00* (2006.01)

(58) Field of Classification Search
USPC .......................................... 439/578–585, 63
See application file for complete search history.

(56) References Cited

U.S. PATENT DOCUMENTS

| | | | | |
|---|---|---|---|---|
| 4,737,124 | A | * | 4/1988 | Ezure .................... H01R 24/00 |
| | | | | 439/585 |
| 4,909,751 | A | * | 3/1990 | Marolda, Jr. ........ H01R 13/523 |
| | | | | 439/936 |
| 5,074,809 | A | | 12/1991 | Rousseau |
| 5,217,391 | A | * | 6/1993 | Fisher, Jr. .............. H01R 24/44 |
| | | | | 439/578 |
| 5,474,470 | A | | 12/1995 | Hammond, Jr. |
| 7,071,416 | B2 | * | 7/2006 | Ricco ................... H01R 13/521 |
| | | | | 174/653 |
| 8,113,860 | B2 | * | 2/2012 | Sandwith ............. H01R 13/521 |
| | | | | 439/271 |
| 9,362,679 | B2 | * | 6/2016 | Schreier ............. H01R 13/6471 |
| 10,164,384 | B2 | * | 12/2018 | Maruyama ............. H01R 24/50 |
| 2015/0325956 | A1 | * | 11/2015 | Schreier ............. H01R 13/6471 |
| | | | | 439/660 |
| 2018/0048101 | A1 | | 2/2018 | Maruyama et al. |

\* cited by examiner

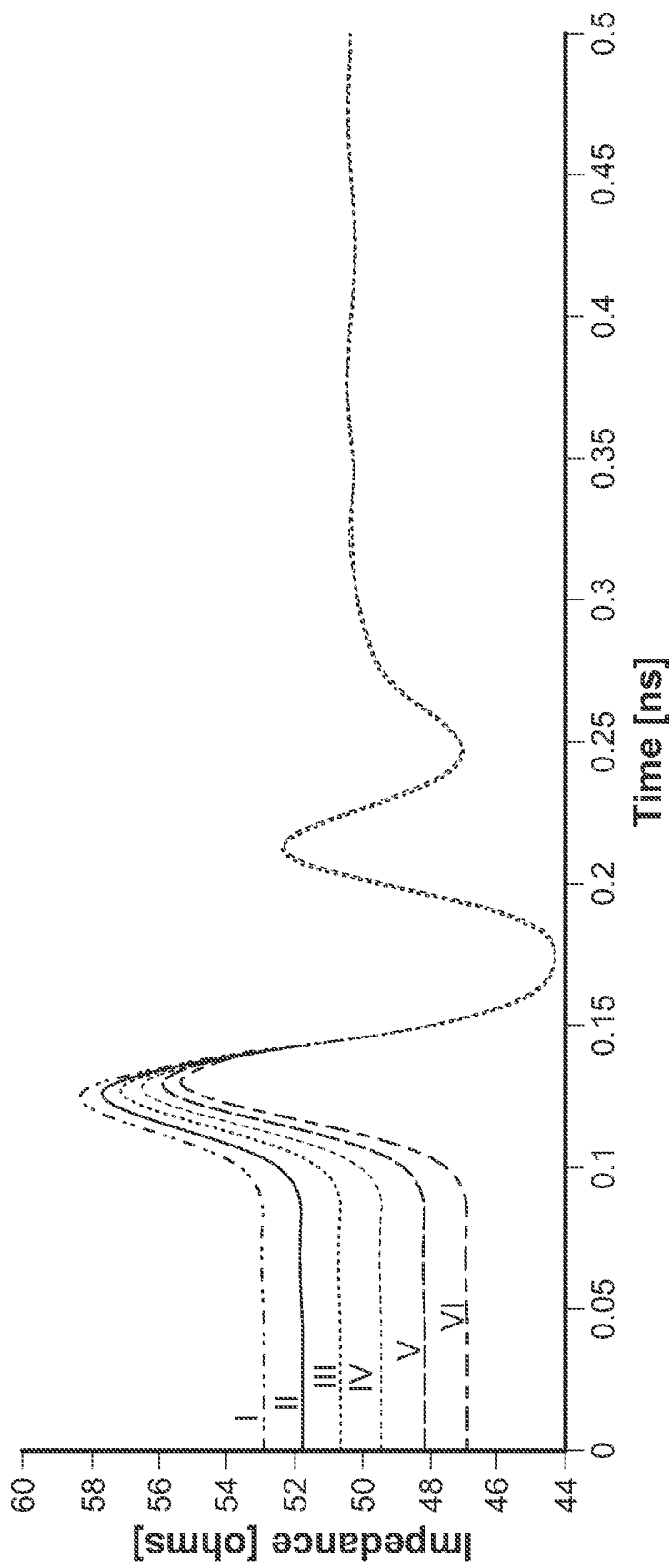
Fig. 3: Exemplary TDR time signals in preparatory step I

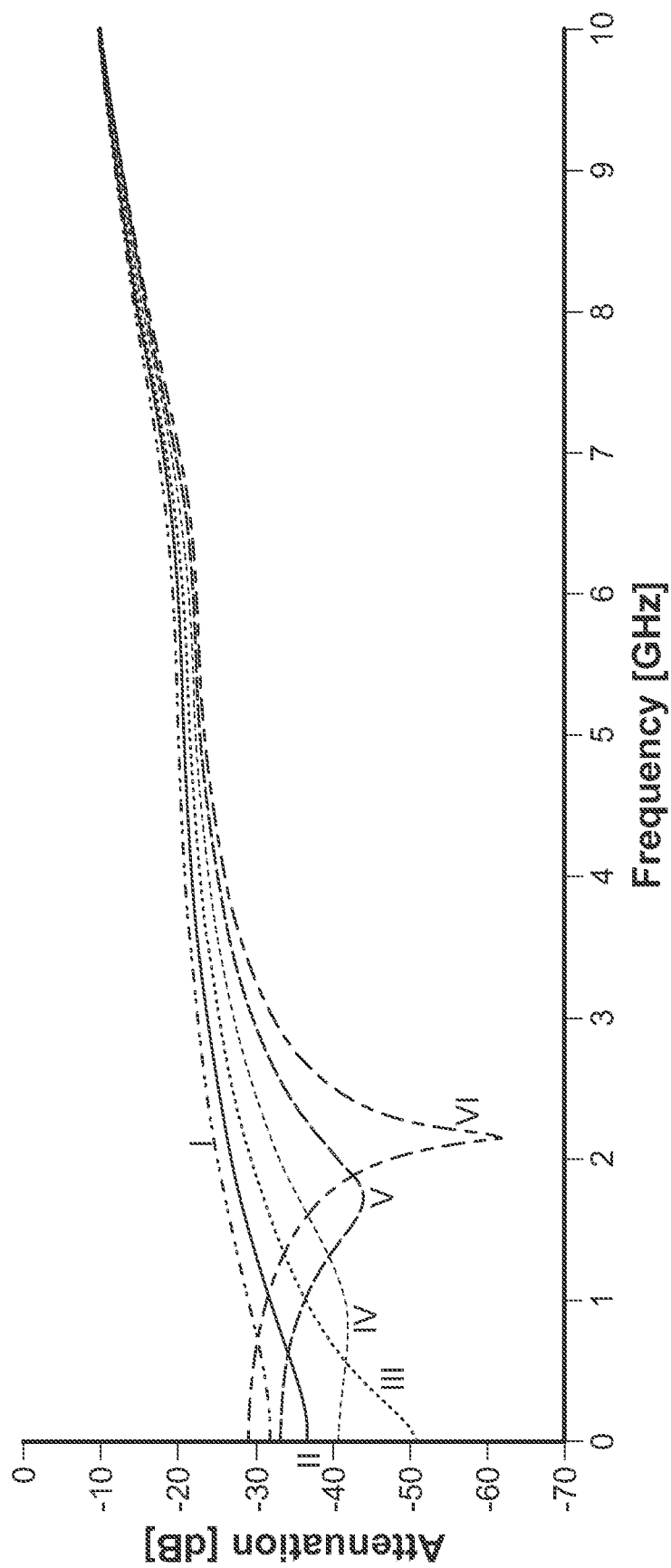
Fig. 4: S-parameters corresponding to the TDR time signals of Fig.3 in preparatory step I

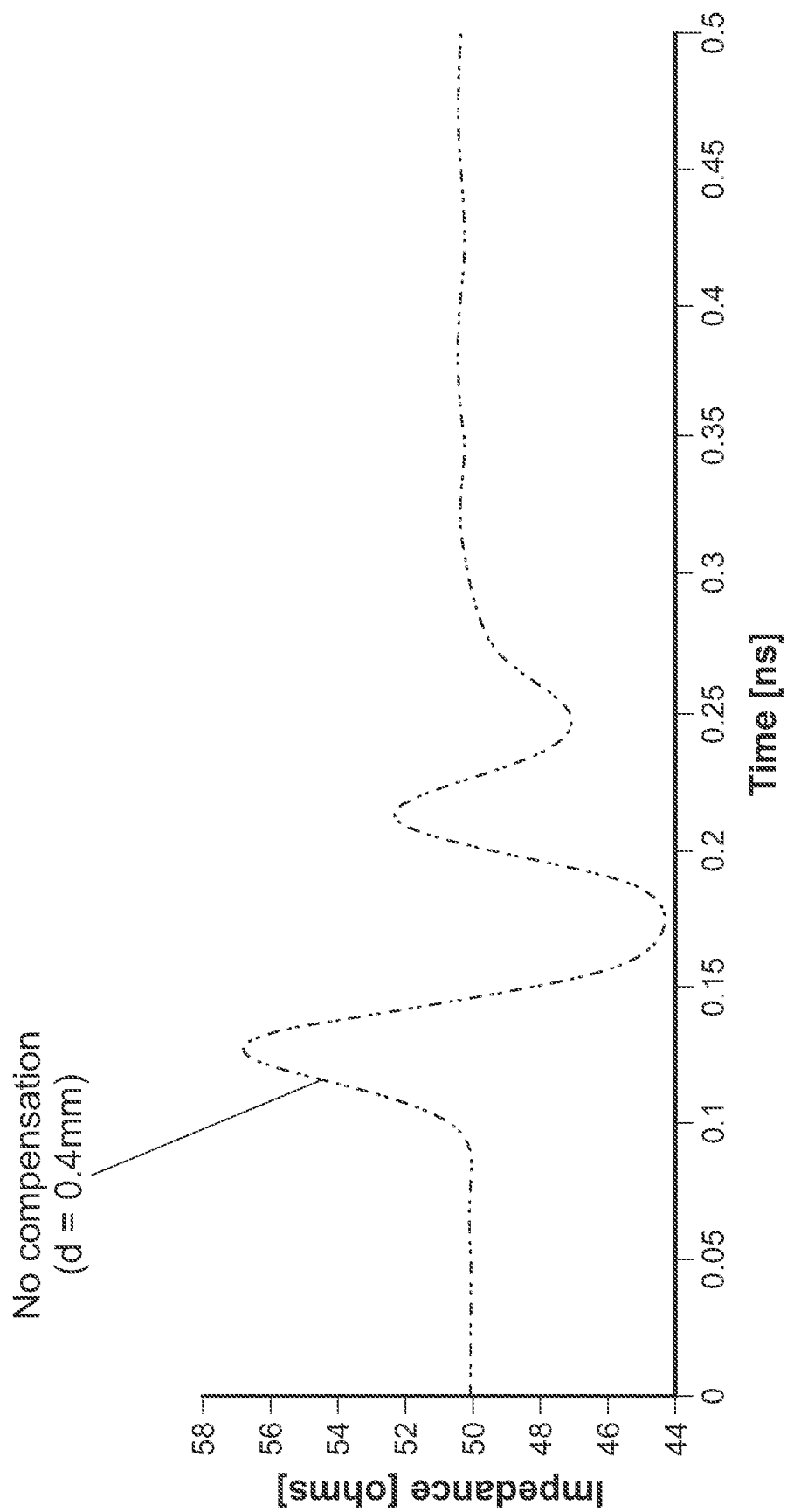
Fig. 5: TDR time signal selected in preparatory step I

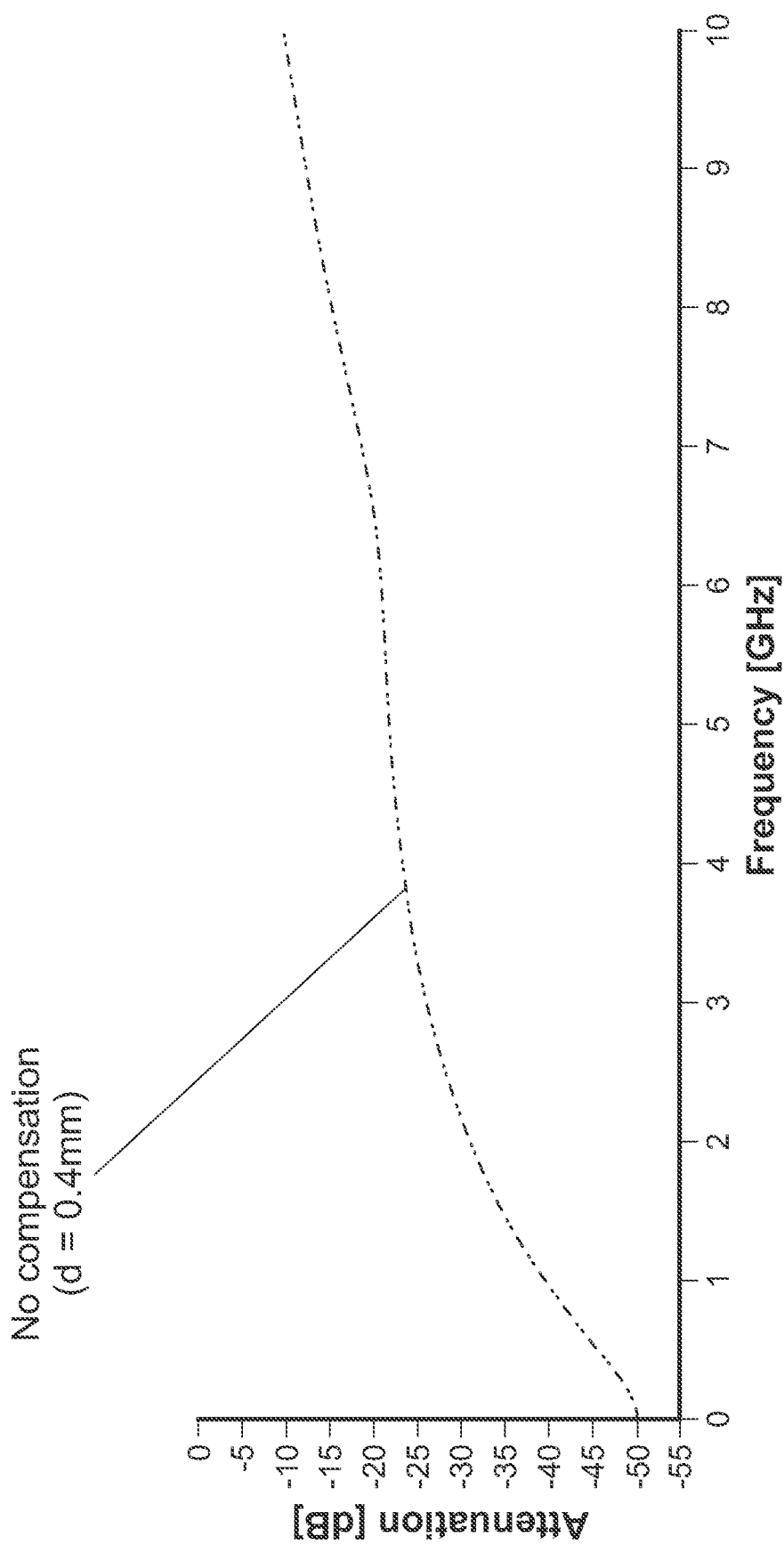
Fig. 6: S-parameters corresponding to the TDR time signal of Fig.5 in preparatory step I

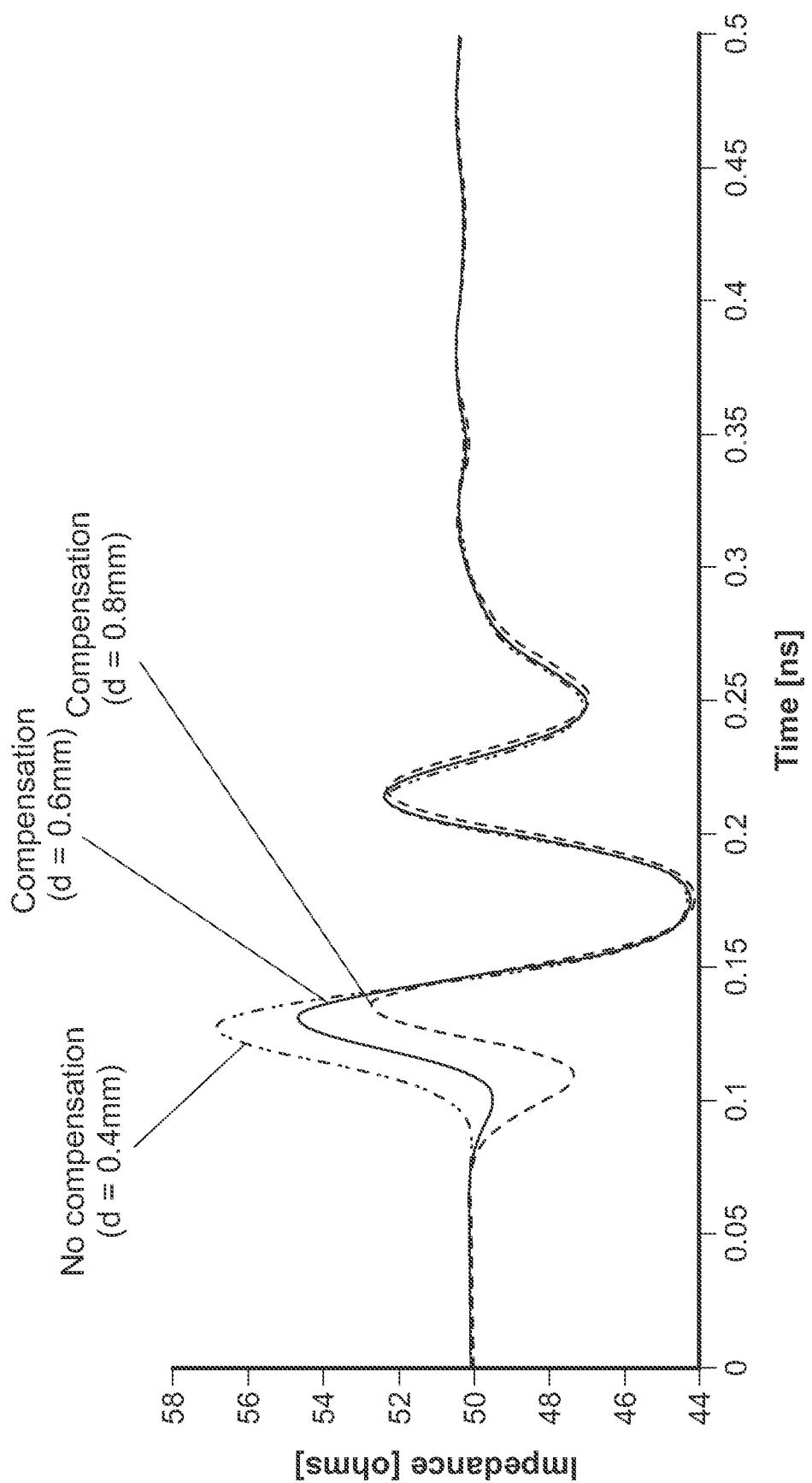
Fig. 7: TDR time signals in design step II

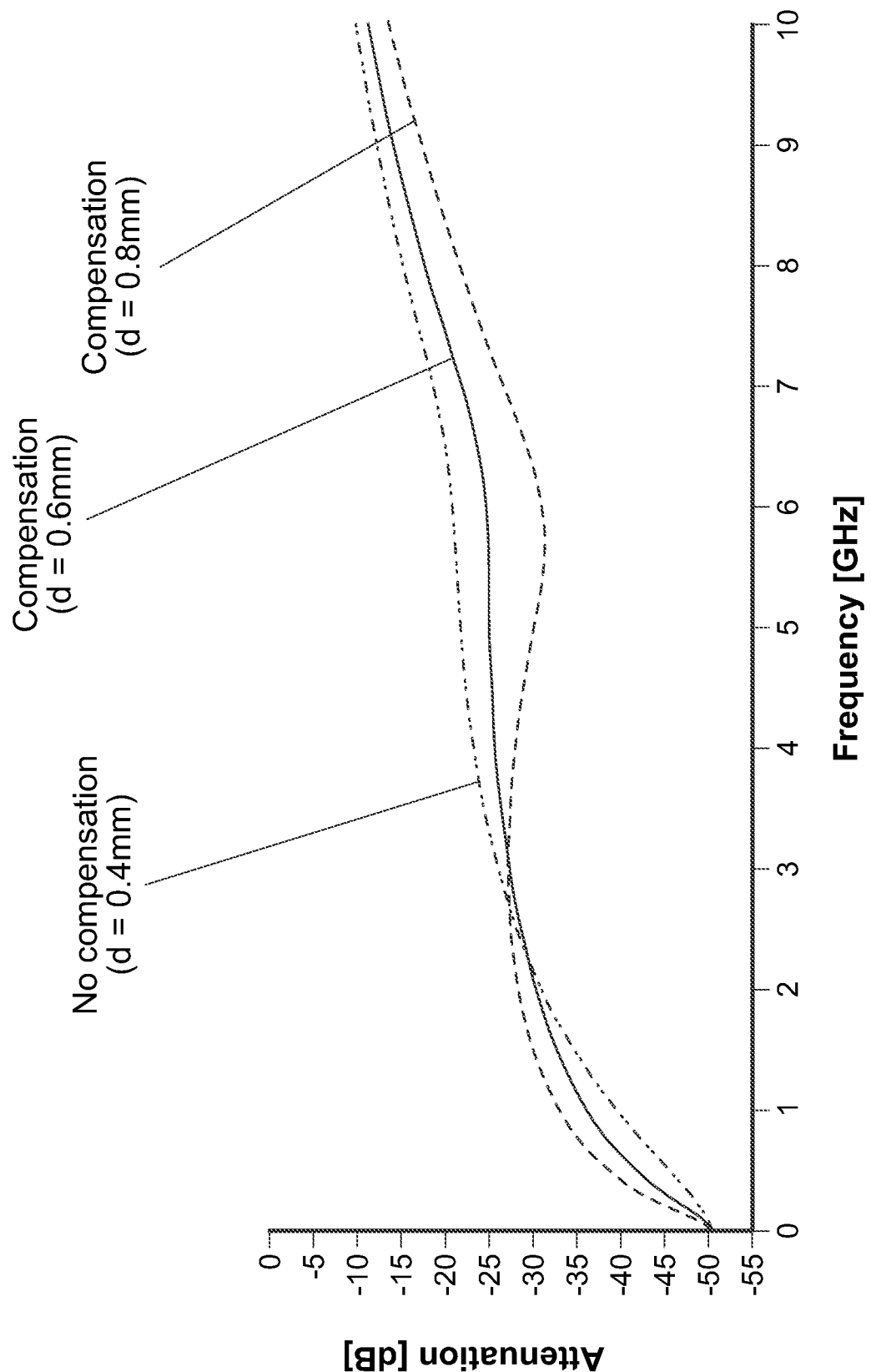
Fig. 8: S-Parameters in design step II

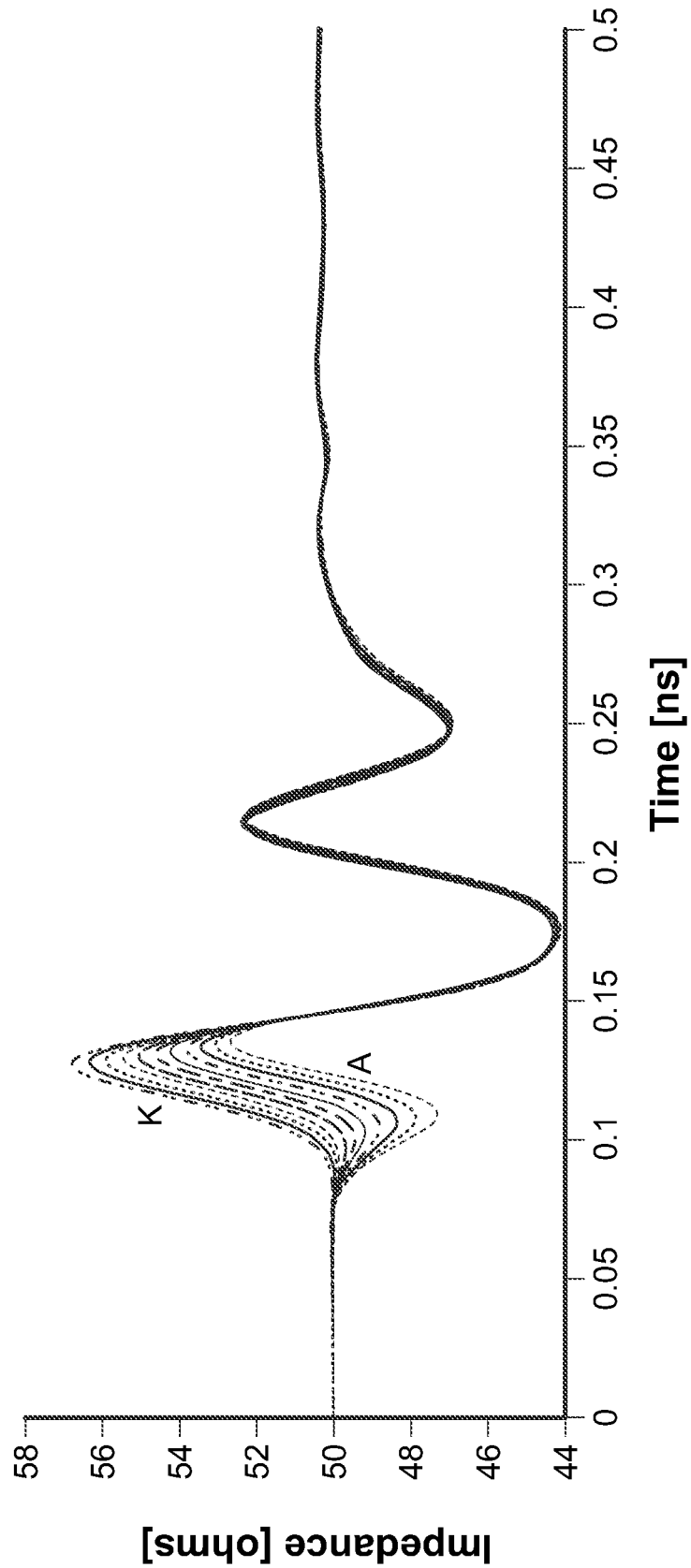

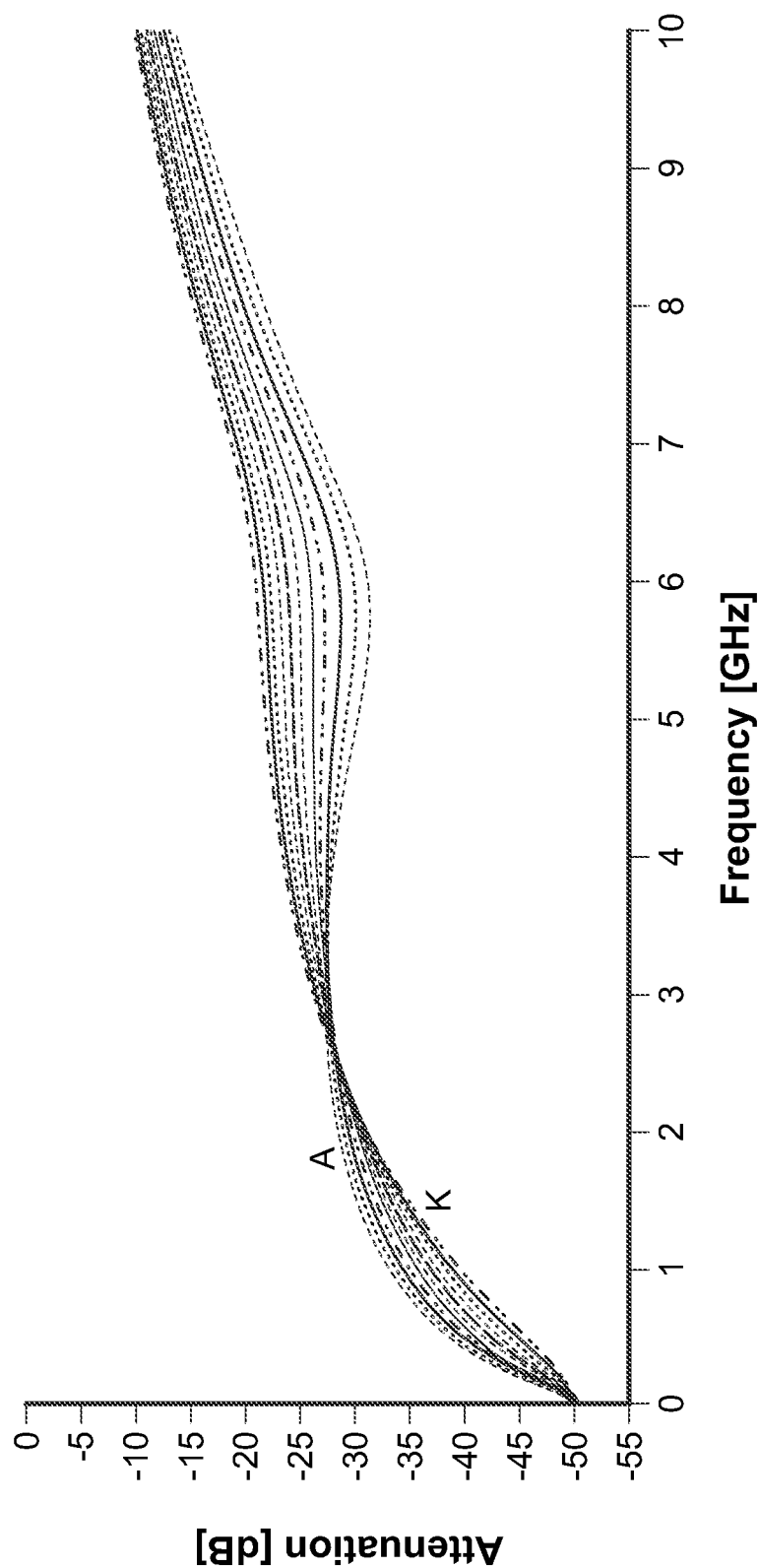
Fig. 10: S-parameters for impedance checking

HF TERMINAL FOR AN HF CONNECTOR, AND A METHOD FOR IMPROVING THE QUALITY OF A SIGNAL INTEGRITY OF A MALE HF CONNECTOR OR OF AN HF PLUG-IN CONNECTOR

CROSS-REFERENCE TO RELATED APPLICATION

This application claims the benefit of the filing date under 35 U.S.C. § 119(a)-(d) of German Patent Application No. 102019130743.0, filed on Nov. 14, 2019.

FIELD OF THE INVENTION

The present invention relates to a connector and, more particularly, to a high frequency (HF) terminal for an HF connector.

BACKGROUND

In the electrical sector (electronics, electrical engineering, electrical equipment, electrical energy technology etc.) a large number of electrical connecting devices or connecting apparatus, sockets, pins and/or hybrid connectors etc.— referred to below as (electrical) connectors (also: mating connectors)—are known, and serve to transmit electrical currents, voltages, signals and/or data with a wide range of current, voltage, frequency and/or data rate values. In the field of low, medium or high voltages and/or currents, and in particular in the vehicle sector, such connectors, installed in mechanically stressed, warm or hot, dirty, damp and/or chemically aggressive environments, are required to ensure a transmission of electrical power, signals and/or data continuously, repeatedly and/or for a short period following a comparatively long period of inactivity. Due to the wide spectrum of applications, a large number of specially developed connectors are known.

Such a connector and, if relevant, its associated housing (e.g. in the case of a connecting device or connecting apparatus) or higher level housing (e.g. in the case of a connecting apparatus), can be installed at an electrical line, a cable, a cable tree etc.—referred to below as an assembled (electrical) cable—or at/in an electrical equipment or device, such as for example at/in a housing, at/on a lead frame, at/on a circuit board etc., a (power) electrical, electro-optical or electronic constituent part, or a corresponding aggregate etc. (electrical entity).

If a connector (with/without housing) is located at a cable, a line or a cable tree, then a flying (plug-in) connector or plug, socket and/or coupling is spoken of; if it is located at/in an electrical, electro-optical or electronic constituent part, aggregate etc., then a connector apparatus such as e.g. a (mounting/attachment) connector, a (mounting/attachment) plug or a (mounting/attachment) socket is also spoken of. A connector at such an apparatus is furthermore also often referred to as a (plug) receptacle, pin connector, pin strip or header.

Such a connector must ensure a problem-free transmission of electricity, while connectors that correspond to one another and are complementary parts (connector and mating connector) usually comprise locking apparatus and/or fastening apparatus for locking and/or fastening the connector at/in the mating connector or vice versa in a manner that is permanent but as a rule releasable. Further, an electrical connecting apparatus for a connector, e.g. comprising or including an actual contact device (terminal; usually designed as one piece of material or integral, e.g. a contact element etc.) or a contact apparatus (terminal; usually designed of multiple pieces, two pieces, one piece, one piece of material or integral, e.g. a one-piece or multi-piece (crimp) contact device), must be securely held therein. In the case of a (pre-) assembled electrical cable, such a connecting apparatus can be provided in the form of a connector (cf. above), i.e. without a housing, e.g. flying.

Efforts are always underway to improve electrical connectors and their terminals, in particular to configure them more effectively as well as to design and/or manufacture them more economically. In HF technology (high frequency: HF, defined here as frequencies greater than 3 up to greater than 300 MHz and significantly into the gigahertz range (approximately 150 GHz)), other rules apply from those in conventional electrical engineering (here defined as frequencies lower than about 3 MHz), since in HF technology particularly the wave-properties of electricity become relevant. HF connectors thus react very sensitively to air gaps in the longitudinal direction between the involved dielectric materials of a pair of HF terminals of a relevant HF plug-in connector. This means that an air gap should be as small as possible, so that the signal integrity of the HF connection is only slightly impaired as a result of the air gap.

HF connectors must therefore have only small or very small tolerance ranges. For this reason, many HF connectors are designed as screw-in HF connectors, by which the tolerances can be kept small, while the air gaps that occur here only extend over small distances. In comparison with a plug-in connector, a screw-in HF connector is, however, significantly more complicated to handle, needs a longer time to set up, and is significantly more expensive.

SUMMARY

A high frequency (HF) terminal for an HF connector includes an electromechanical contact section, a mechanical fastening section, an electromechanical connection section, and an HF compensation region apart from the electromechanical contact section. The HF compensation region is geometrically developed in such a way that a loss in a signal integrity of an HF plug-in connector including the HF connector with the HF terminal and an HF mating connector with an HF mating terminal in a final plugged-in position can be at least partially compensated by the HF compensation region.

BRIEF DESCRIPTION OF THE DRAWINGS

The invention will now be described by way of example with reference to the accompanying Figures, of which:

FIG. 3 is a graph of simulated TDR time signals in a preparatory step of a simulation method for increasing the quality of a signal integrity of an HF plug-in connector;

FIG. 4 is a graph of S-parameters corresponding to the TDR time signals of FIG. 3 in the preparatory step of the simulation method;

FIG. 5 is a graph of a TDR time signal selected in the preparatory step as a representative for an HF plug-in connector for increasing the quality with which the simulation method is further continued;

FIG. 6 is a graph of an S-parameter corresponding to the TDR time signal of FIG. 5, also as a representative for the HF plug-in connector for quality improvement, with which the simulation method is continued;

FIG. 7 is a graph of simulated TDR time signals in a design step of the simulation method for increasing the quality of a signal integrity of an HF plug-in connector;

FIG. 8 is a graph of line diagrams of S-parameters corresponding to the TDR time signals of FIG. 7 in the design step of the simulation method;

FIG. 9 is a graph of line diagrams of simulated TDR time signals for impedance checking in the design step of the simulation method for improving quality;

FIG. 10 is a graph of line diagrams of S-parameters corresponding to the TDR time signals of FIG. 9 for impedance checking in the simulation method;

DETAILED DESCRIPTION OF THE EMBODIMENT(S)

Figure 1:
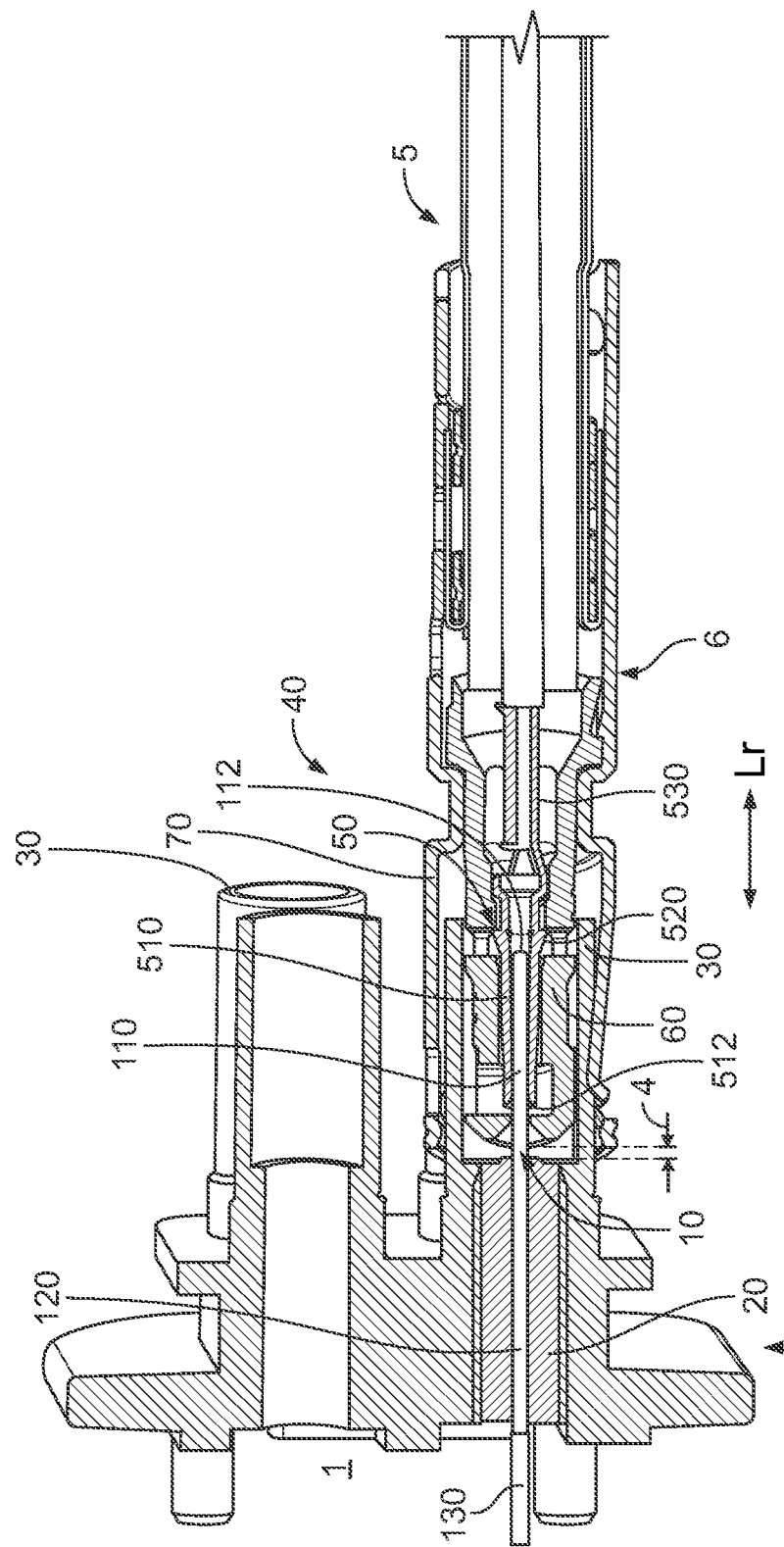
FIG. 1 is a sectional perspective view of an HF plug-in connector according to an embodiment.

The invention is explained in more detail below with reference to exemplary embodiments and also with reference to the appended drawings which are schematic and not to scale. Sections, elements, components, units, constituent parts and/or diagrams that have an identical, univocal or analogue design and/or function are identified with the same reference signs. A possible alternative, not explained in the description, not illustrated in the drawing and/or not final, a static and/or kinematic inversion, a combination etc. of the exemplary embodiments of the invention, or of a constituent part, a diagram, a unit, a component, an element or a section thereof can furthermore be inferred from the list of reference signs and/or the description of the figures.

A feature of this specification cannot only be applied in a given manner, but also in a different manner (assembly, replacement, addition, unique position, omission etc.). It is in particular possible, on the basis of a reference sign and a feature assigned to it or vice versa, to replace, add or omit a feature.

The features of the description can (from the point of view of the (initially generally unknown) prior art) also be interpreted as optional features. It is thus possible for a feature, in some cases including its periphery, to be detached from an exemplary embodiment, wherein this feature can then be transferred to a generalized inventive idea. The absence of a feature (negative feature) in an exemplary embodiment indicates that the feature is optional with respect to the invention. A species term for a feature can further also be read as a generic term for the feature (which may involve further hierarchical division into sub-classes etc.) whereby, for example, by considering equivalent effect and/or equivalent value, a generalization of the feature is possible.

The invention is explained in more detail below with reference to exemplary embodiments of a variant of a high frequency (HF) plug-in connector 2, 6; 40 of an HF plug-in connector 2 and an HF mating plug-in connector 6, as shown in FIGS. 1, 2, 11 and 12, for the vehicle sector in an embodiment. The invention is further explained in more detail with reference to exemplary embodiments of a variant of a method for increasing quality of a signal integrity of a male HF connector 2 and/or of an HF plug-in connector 2, 6; 40, as shown in FIGS. 3 to 10, such as for the vehicle sector. Such an HF connector 2 is particularly suitable for an HF coaxial plug-in connector 2, 6; 40 or an HF twisted pair plug-in connector 2, 6; 40. In particular, the HF connector 2 is designed as an HF connector 2 that can only be plugged in and not screwed.

Although the invention is described in more detail and illustrated through exemplary embodiments, the invention is not restricted by the disclosed exemplary embodiments, but is of a fundamental nature. Other variations can be derived by the expert from this without leaving the scope of protection of the invention.

The invention is thus also generally applicable to a corresponding electrical constituent part and/or in a non-vehicle sector such as for example an entertainment electronics sector, a power electronics sector, an electrical engineering sector etc. and quite generally in technology. This means that the invention is generally applicable to an electrical entity 1, 5. Ground-based electrical energy technology and its derivatives in vehicles form an exception here.

Only those spatial sections of an object of the invention that are necessary for an understanding of the invention are illustrated in the drawing. Designations such as connector and mating connector, terminal and mating terminal etc. are to be interpreted synonymously, i.e. may in some circumstances be interchangeable.

Tolerances for the insertion depths of HF connectors 2, 6 typically cause peaks in an impedance profile of an HF plug-in connector 2, 6; 40, for example from two high-speed data connectors for transmission rates above 1 GHz in the vehicle sector, as shown in FIG. 3. The electrical signal travels along an electromagnetic path from an HF connector 2/6, via the HF plug-in connector 2, 6; 40 to the other HF connector 6/2, or vice versa. Ideal preconditions for such an HF plug-in connector 2, 6; 40 would be constant internal diameters and the same dielectric material within the HF plug-in connector 2, 6; 40 with an impedance of, for example 50 ohms (see above). This means that there are no reflections, and that a very good signal integrity performance is ensured.

Depending on the type, the tolerances at the contact sections 110, 510 can here add up to more than 1.4 mm. Other tolerance situations can of course also be handled according to the invention. In particular in the case of HF coaxial plug-in connectors or HF twisted pair plug-in connectors, these tolerances entail annular air gaps between the dielectric materials 20, 60 of the HF terminals 10, 50. This means that a relevant HF terminal plug-in connector 2, 6; 40 is here partially surrounded by an annular air gap. Since this annular air gap and the dielectric materials 20, 60 that are adjacent in the two longitudinal directions have a significantly different permittivity, this has significant effects on the signal integrity of the HF plug-in connector 2, 6; 40.

As a result of the tolerances of the HF connector 2, 6, a dielectric air gap 4 arises between the dielectric materials 20, 60 of the HF connector 2, 6 in the HF plug-in connector 2, 6; 40, as shown in FIG. 1. When the electrical signal reaches this air gap 4, an inductive peak forms because of an erroneous impedance match in this region of the HF plug-in connector 2, 6; 40. This air gap 4 is unavoidable, and has significant negative effects on an HF performance of the HF plug-in connector 2, 6; 40. A typical axial tolerance range is about 1.4 mm, with the addition of about 1 mm additional overlap of the terminals 10, 50 involved, so that the terminals 10, 50 can also be securely plugged into one another (length of a contact region 110, 510 of the terminal 10, 50 greater than or equal to 2.4 mm).

Each one of these HF connectors 2, 6 comprises at least: radially outside, a screen conductor sleeve 30, 70, a dielectric material 20, 60 provided radially inside the screen conductor sleeve 30, 70, and an HF terminal 10, 50 provided radially inside in the dielectric material 20, 60, as shown in FIG. 1. The screen conductor sleeve 30, 70 does not here have to constitute a radially outward boundary of the HF connector 2, 6 (housing, outer housing etc.). In the present case the HF connector 2 is designed as a male HF plug-in connector 2 with an (internal) male HF terminal 10, and the HF connector 6 as a female HF mating plug-in connector 6 with an (internal) female HF mating terminal 50.

The male HF terminal 10, as shown in FIG. 1, is divided in its longitudinal direction Lr into an electromechanical contact section 110 with an insertion region 112 that is rounded or bevelled radially outside in an embodiment and is free at the front, a mechanical fastening section 120 in the dielectric material 20, and an electromechanical connection section 130 that can, for example, be designed as a press-fit section, a soldered section, a welded section, a crimped section and so forth. In the present case, the screen conductor sleeve 30 of the male HF connector 2 is constructed integrally with a header, which is, however, optional according to the invention. The HF terminal 10 can be constructed as a contact device (see above) or a contact apparatus (see above), and in particular as a pin terminal. The HF terminal 10 can if appropriate of course also be constructed as a tab terminal, a hermaphroditic terminal and so forth.

The contact sections 110, 510 provide an electromechanical contact of the HF terminal 10 with the HF mating terminal 50, the fastening section 120 acts to provide a fastening of the HF terminal 10 in a dielectric 20 or in a housing, and the junction section acts to provide a further electromechanical contact of the HF terminal. The fastening section 120 can here comprise the junction section and/or can help to perform its tasks. The fastening section 120 and the junction section can consequently be housed in a common section in the HF terminal 10.

The female HF terminal 50, as shown in FIG. 1, is divided in its longitudinal direction Lr into an electromechanical contact section 510 with an insertion region 512 that is rounded or bevelled radially inside in an embodiment and is free at the front, a mechanical fastening section 520 in the dielectric material 60, and an electromechanical connection section 530 that in the present case can be designed as a crimped section, but also, for example, as a press-fit section, a soldered section, a welded section and so forth. In the present case, the screen conductor sleeve 70 of the female HF connector 6 is constructed as a crimpable screen conductor sleeve 70, which is, however, optional according to the invention.

A final plugged-in position of the two HF terminals 10, 50 (i.e. of the HF terminal according to the invention with respect to the relevant mating terminal in the HF plug-in connector) of the in particular exclusively plugged-in (i.e. not (additionally) screwed) HF plug-in connector 2, 6; 40 consisting of HF connector 2 and HF mating connector 6 is (also) subject to tolerance in the longitudinal direction Lr of the HF plug-in connector 2, 6; 40; as is also the case with other plug-in connectors. This final plugged-in position, subject to tolerance has (see below) an effect on the signal integrity of the HF plug-in connector 2, 6; 40, or a certain loss of the signal integrity of the HF signal connector as a consequence.

Figure 2:
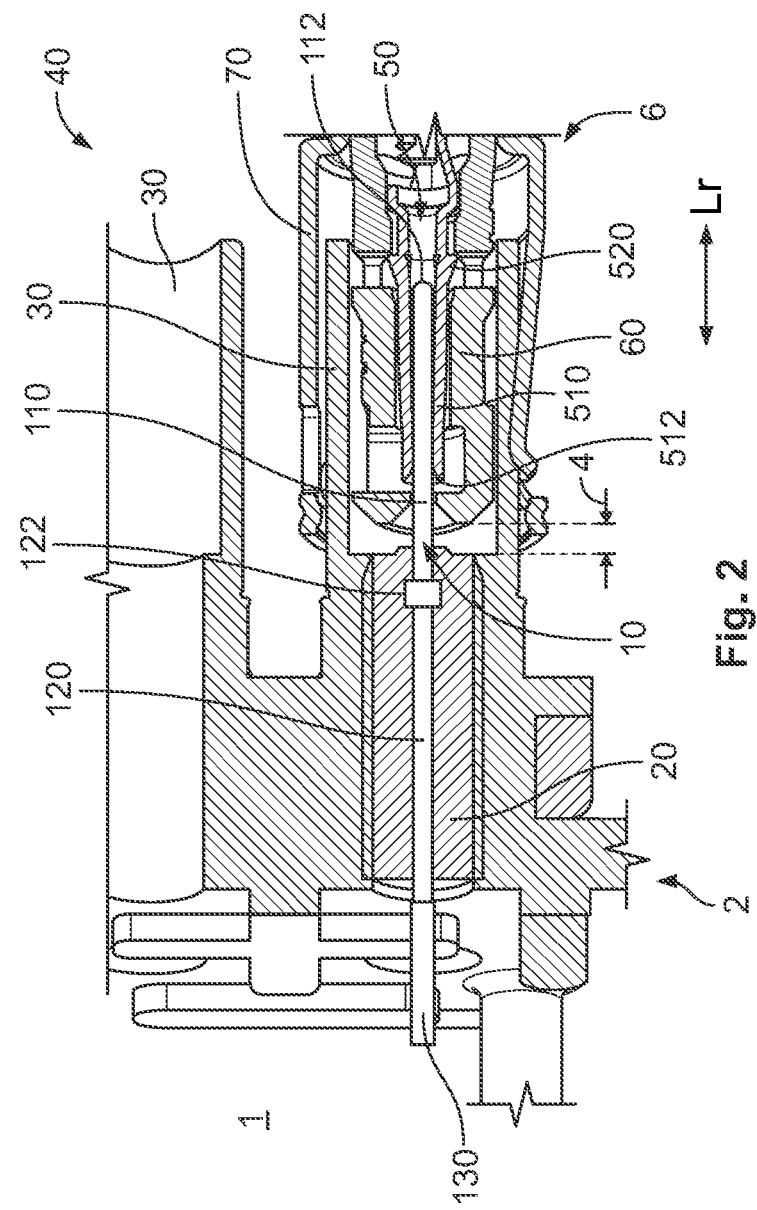
FIG. 2 is a detail sectional perspective view of the HF plug-in connector.

According to the invention, a compensation region 122, shown in FIG. 2, is provided at/in the male HF terminal 10 in such a way that a loss in a signal integrity of the HF plug-in connector 2, 6; 40 can be partially compensated and/or is partially compensated as a result of this HF compensation region 122. This results, for example, from a tolerance-based final plugged-in position of the HF plug-in connector 2, 6; 40 consisting of the male HF terminal 10 and the female HF mating terminal 50.

The HF compensation region 122 refers to a form or shape at and/or in the HF terminal 10 which on the one hand differs from a conventional form of the HF terminal 10 in the longitudinal direction Lr in front of and/or behind the HF compensation region 122, and on the other hand has the (passive) ability to compensate partially for the loss of the signal integrity of the HF plug-in connection. A certain loss of signal integrity of the HF plug-in connector 2, 6; 40 can hereby be compensated for. This means that according to the invention a potential deterioration in the signal integrity of the HF plug-in connector 2, 6; 40 resulting from the air gap 4 between the dielectric materials 20, 60 of is countered by the HF compensation region 122 (static compensation). The HF compensation region 122 here acts as an impedance compensator, an impedance compensation device or an impedance compensation material. The design of the HF terminal 10 according to the invention helps to match the impedance caused in this region by the dielectric air gap 4, and improves the HF performance of an HF plug-in connector 2, 6; 40.

The HF compensation region 122 is here developed geometrically of one piece of material and fastened at/in the male HF terminal 10 or integrally constructed with the male HF terminal 10. The compensation region 122 is in particular provided as a protuberance 122 of the HF terminal 10. In an embodiment, the compensation region 122 is provided aside from the contact section 110 at/in the male HF terminal 10. The HF compensation region 122 can here be provided at/in the fastening section 120 or between the contact section 110 and the fastening section 120 at/in the HF terminal 10. The HF compensation region 122 can here be arranged in an HF connector within a dielectric 20, 60, wherein the compensation region 122 acts as what may be the only (positive locking and/or friction locking) fastening of the HF terminal 10, 50 in the dielectric 20, 60.

The HF compensation region 122 can be provided or arranged at one side, two sides or multiple sides, around part of the circumference or around all of the circumference at/in the male HF terminal 10. The HF compensation region 122 can here be divided into at least two molding regions that together form the HF compensation region 122. This is, for example, the case with a two-sided HF compensation region 122 of the HF terminal 10. It is of course possible to provide the HF compensation region 122 in a three-sided, four-sided, or many-sided form.

Figure 12:
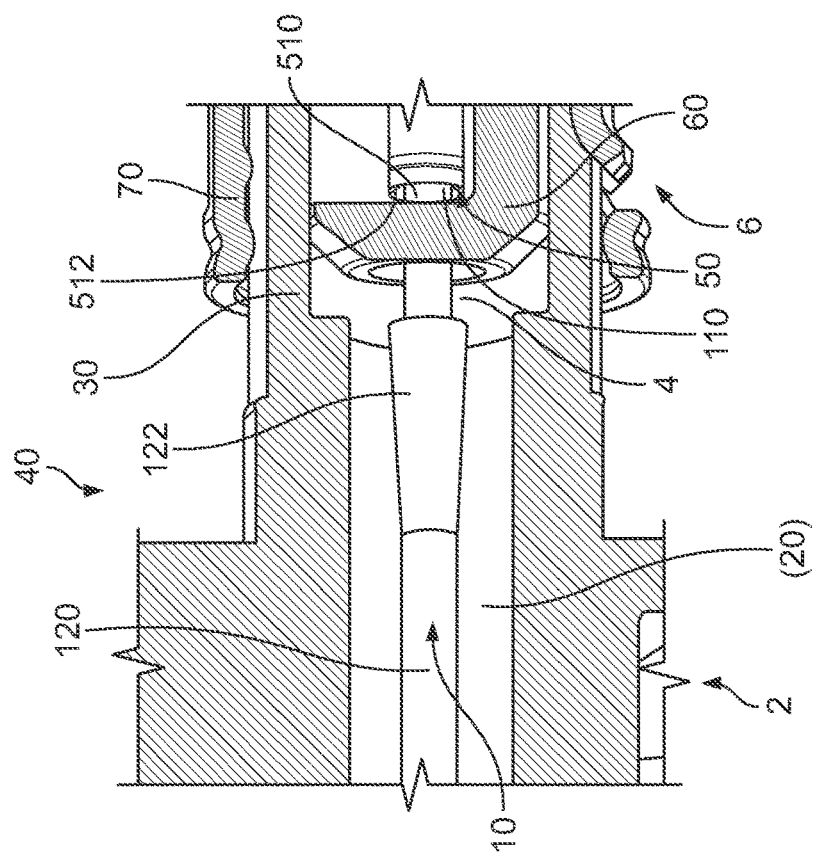
FIG. 12 a detail sectional perspective view of an HF plug-in connector with an HF compensation region according to another embodiment.
Figure 11:
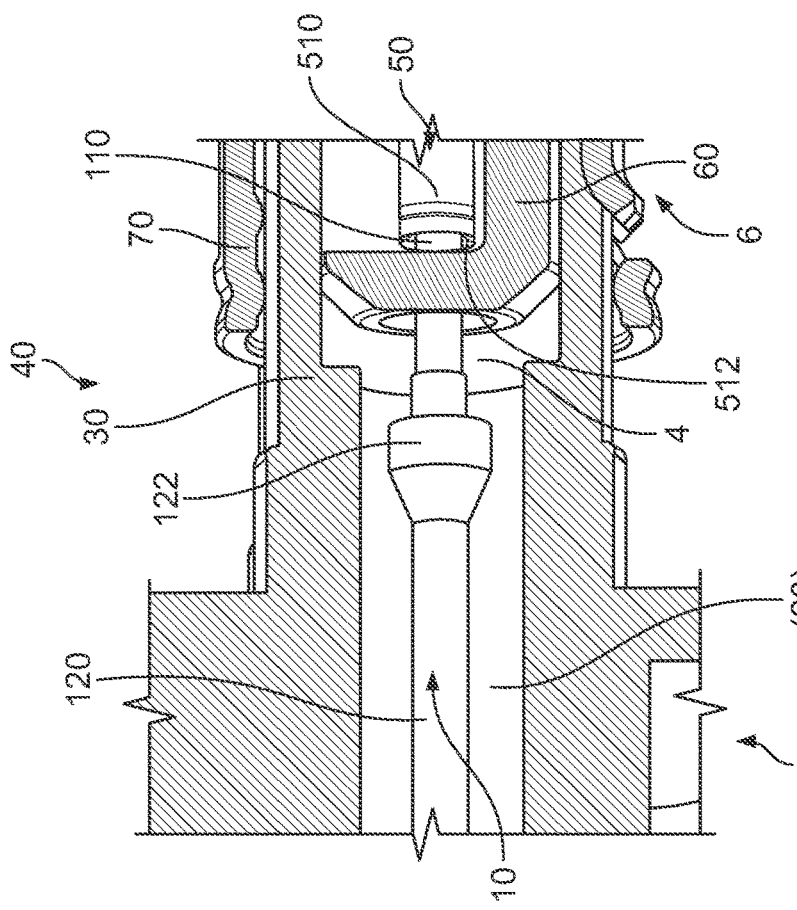
FIG. 11 is a detail sectional perspective view of an HF plug-in connector with an HF compensation region according to an embodiment.

In FIG. 2, the male HF terminal 10 has a rectangular or square cross-section, wherein the compensation region 122 is provided on two sides (above and below in FIG. 2, transverse to the longitudinal direction Lr, flush with the two longitudinal sides of the male HF terminal 10). In FIGS. 11 and 12, the male HF terminal 10 has an elliptical, circular, or quadratic cross-section, wherein the compensation region 122 is provided around the full circumference. It is of course possible for the compensation region 122 to be provided around part of the circumference.

Apart from an insertion region of its contact section 110, its HF compensation region 122, and its junction section, the HF terminal 10 can be designed as a straight, solid cylinder (male HF terminal). A base area of this solid cylinder can here be rectangular, in particular essentially square, elliptical, in particular essentially circular, prismatic and so forth.

Cross-section of the HF compensation region 122 can be provided or arranged in the HF terminal point-symmetrically with respect to a longitudinal axis of the HF terminal 10, or mirror-symmetrically with respect to a section plane of the HF terminal 10.

This relates to all the cross-section of the HF compensation region 122 or of the protuberance. A size, a shape and/or a position of cross-section of the HF terminal 10 can be essentially identical in the longitudinal direction Lr in sections at least immediately in front of and/or behind the HF compensation region 122. A cross-section of the HF terminal 10, or a cross-section of the contact section 110, of the fastening section and/or of the junction section—leaving aside the HF compensation region 122—can be rectangular, in particular essentially square, or elliptical, in particular essentially circular in design.

The HF compensation region 122 can be arranged as a protuberance in a central section of the HF terminal 10. The protuberance can here, depending on a design of the HF terminal 10 and its cross-section, be provided or arranged altogether as a rectangular solid, cuboid, possibly on one side or partially surrounding on more than one side; or have the shape of an ellipsoid, an oval, or sphere. At least some of the cross-section or all of the cross-section of a longitudinal section of the HF compensation region 122, of the protuberance or of a molding region can here be the same as and flush with one another in the longitudinal direction Lr.

According to the invention it is possible with two essentially identical HF terminals 10 that one terminal has a larger compensation region 122, or a compensation region 122 with greater dimensions, which is configured for higher frequencies, as shown in comparison with FIG. 8. The protuberance can furthermore have exclusively or partially constant dimensions or diameters in the longitudinal direction Lr. The protuberance can furthermore comprise a bevel exclusively or partially in the longitudinal direction. In particular, the HF terminal 10 can be designed as an HF terminal 10 that can only be plugged in and not screwed. The HF terminal 10 can here be manufactured for example through a punching process and a shaping process (pressing process, stamping process etc.) that may follow it in time, by a turning process, as a compressed wire and so forth.

The HF terminal 10 with its HF compensation region 122 or its protuberance can be designed as a single or integral piece of material. An integral design refers to formation of the HF terminal 10 in which there is only a single component which can only be divided destructively. The component is manufactured from a single starting piece (metal sheet, blank etc.) and/or from a single starting mass (molten metal), which is therefore necessarily integral for its part. It is held together internally by adhesion and/or cohesion. A materially (adhesively) one-piece design refers to a design of the HF terminal whose individual parts are fixed to one another materially (welding, soldering, gluing etc.), and which cannot be separated into its individual parts without damage to one of its individual parts. The cohesion can here furthermore be created by means of a friction and/or positive locking (not with integral design).

A suitable dimension, or diameter, of the compensation region 122 or of the male HF terminal 10 in the compensation region 122 is determined by the method according to the invention for increasing quality. A position of the compensation region 122 in the longitudinal direction Lr at/in the male HF terminal 10 is here essentially negligible, as is a position in the circumferential direction at/in the male HF terminal 10. A radial dimension of the compensation region 122 for example is, however, important e.g. in a single radial direction (one-sided compensation region 122) in two mutually opposed radial directions (two-sided, in an embodiment symmetrical compensation region 122) and in all radial directions (compensation region 122 around the full circumference).

The method is carried out as a computer-aided simulation method. It is, of course, also possible not to simulate the relevant data but to measure at real HF plug-in connectors 2, 6; 40. In order to ascertain an HF plug-in connector 2, 6; 40 with improved quality with an air gap 4 between the dielectric materials 20, 60 of the male HF connector 2 and of the female HF mating connector 6, this assembly is first converted to a computer model. The air gap 4 between the dielectric materials 20, 60 in particular can, furthermore, be configured in the preparatory step. The air gap 4 remains configured during the entire process, and has a specific diameter, e.g.: 0.35 mm, 0.4 mm, 0.45 mm, 0.5 mm, 0.55 mm, 0.6 mm, 0.7 mm, 0.8 mm, or 1.0 mm.

In a preparatory step I of the method, at least one uncompensated signal integrity of the HF plug-in connector 2, 6; 40 is determined with reference to this computer model. The male HF terminal 10 and the HF plug-in connector 2, 6; 40 should here have a previously selected, specific impedance of, for example, 50 ohms. If this is not the case, the relevant diameters of the male HF terminal 10 and of the HF plug-in connector 2, 6; 40 must be determined, and the HF terminal 10 and the HF plug-in connector 2, 6; 40 appropriately configured. This means that the male HF connector 2 and/or the HF plug-in connector 2, 6; 40 must here be configured for this impedance in spite of the air gap 4; in FIGS. 3 and 5, the impedance in front of and behind the inductive peak).

A typical diameter of e.g. 0.4 mm or 0.5 mm of the male HF terminal 10 is here freely selected, and following this a geometry of the screen conductor sleeve 30, in particular its internal diameter, or of the header, determined for this impedance. This, for example, takes place using the time-domain reflectometer (TDR) time signals I to VI shown in FIG. 3. The desired impedance of 50 ohms is located between the signals III and IV, which represent specific geometries. Other impedances such as, for example, 75 ohms, 93-125 ohms etc. can of course be used. The geometry for the relevant impedance can be determined hereby. FIG. 4 shows the S-parameters corresponding to the TDR time signals I to VI.

FIG. 5 shows the TDR time signal (TDR time signal between the signals III and IV of FIG. 3) selected in the preparatory step I for the desired 50 ohms. FIG. 6 shows the S-parameters corresponding to this which represent the reference S-parameters on the basis of which the compensation region 122 according to the invention has to be measured; i.e. it must demonstrate reduced attenuation here for an improvement of the quality.

In a design step II of the method, a geometrically determined HF compensation region 122 is now provided at/in the male HF terminal 10, aside from its contact region 110, and a compensated signal integrity of the HF plug-in connector is determined in the computer model. This is repeated with geometrically different HF compensation regions 122. An overall result for two HF compensation regions 122 (diameter of the HF terminal 10 in the HF compensation region 122: d=0.6 mm and d=0.8 mm) is illustrated in FIG. 7 together with the result of the preparatory step I (no compensation). The design step II is, in an embodiment, directly subsequent to the preparatory step I.

FIG. 8 shows the S-parameters corresponding to the TDR time signals of FIG. 7. It is found, as shown in FIG. 8, that larger dimensions or diameters of the HF compensation regions 122 are worse at lower frequencies than at higher frequencies. Starting from the requirements, in particular for a transmission frequency, placed on an HF plug-in connector 2, 6; 40 that is to be designed, a suitable dimension or a suitable diameter for the compensation region 122 is to be selected. The simulation method further shows that with the design of the HF plug-in connector 2, 6; 40 used, and in particular of the male HF terminal 10 that can be developed thereby, an HF performance at specific frequencies or frequency bands (here greater than about 2.4 to 2.7 GHz up to more than 10 GHz, FIG. 8) can be improved.

In forms of embodiment of the invention it can be observed here that at comparatively low frequencies, in FIG. 8: lower than about 2.4 to 2.7 GHz, the HF compensation region 122 becoming larger yields deteriorations in the signal integrity that become greater. At comparatively higher frequencies, in FIG. 8: greater than about 2.4 to 2.7 GHz, the HF compensation region 122 becoming larger yields improvements in the signal integrity that become greater. This can, of course, have other consequences in different forms of embodiment, which can in each case be checked through a method according to the invention. Thus, according to the invention, for a given transmission rate, a specific dimension, in some cases a specific form (e.g. determined by the dimension) and/or in some cases a specific position (e.g. determined by the dimension), of the compensation region 122 is selected and correspondingly configured at/in the HF terminal 10.

In an intermediate step, as shown in FIGS. 9 and 10, an impedance check related to the desired impedance can take place in the design step II. Here, if appropriate, a geometry or dimension of the male HF connector 2, in particular of a diameter of its screen conductor sleeve 30, of the HF plug-in connector 2, 6; 40 and/or of the HF compensation region 122 can be adjusted. In an embodiment, the air gap 4 is designed according to the invention as a fully surrounding annular air gap.

Following the simulation method according to the invention, the compensation region 122 can be further improved. The compensation region 122 can thus have a constant diameter only partially in the longitudinal direction Lr and can further comprise a bevel (FIG. 11) or may be completely constituted of a bevel (FIG. 12). The compensation region 122 can here again be formed on one side, two sides, multiple sides, partially around the circumference, fully around the circumference and so forth.

The HF plug-in connector 2, 6; 40 according to the invention comprises a male HF connector 2 and a female HF connector 6, wherein at least one of the HF connectors 2, 6 is designed according to the invention, and/or the HF connector 2, 6 or the HF plug-in connector 2, 6; 40 was or were or is or are designed by a method according to the invention. The electrical entity according to the invention comprises an HF connector 2 or an HF plug-in connector 2, 6; 40, wherein the HF connector 2 and/or the HF-plug-in connector 2, 6; 40 is designed according to the invention, and/or the HF connector 2 or the HF plug-in connector 2, 6; 40 has been or is configured by a method according to the invention. Such an entity is, for example, configured as an electrical device, an electrical apparatus, a (pre-)assembled electrical HF cable, an electrical assembly, an electrical circuit board, an electrical constituent part, an electrical module, an electrical device, an electrical apparatus, an electrical aggregate, an electrical installation, an electrical system and so forth.

The invention counteracts a deterioration of a signal integrity, also referred to as the terminal spacing effect, in HF plug-in connectors, for example in HF coaxial plug-in connectors or HF twisted pair plug-in connectors, in order to improve a transmittable bandwidth (improvement of the signal integrity) of a relevant HF plug-in connector. In particular, the invention reduces a negative effect on a realizable bandwidth at higher frequencies of the relevant HF plug-in connector resulting from an air gap in a region of the plugged in HF terminals (see also FIG. 8).

What is claimed is:

1. A high frequency (HF) terminal for an HF connector, comprising:
   an electromechanical contact section;
   a mechanical fastening section;
   an electromechanical connection section; and
   an HF compensation region apart from the electromechanical contact section, the HF compensation region is geometrically shaped in such a way that a loss in a signal integrity of an HF plug-in connector including the HF connector with the HF terminal and an HF mating connector positioned around the HF connector with an HF mating terminal in a final plugged-in position can be at least partially compensated by the HF compensation region enclosed in a dielectric material, wherein the HF terminal as a whole extends linearly in a longitudinal direction between the electromechanical contact section and the electromechanical connection section.

2. The HF terminal of claim 1, wherein the HF compensation region is arranged in the mechanical fastening section or is arranged between the electromechanical contact section and the mechanical fastening section.

3. The HF terminal of claim 1, wherein the HF compensation region is a change in a dimension of the HF terminal.

4. The HF terminal of claim 1, wherein the HF compensation region is arranged on at least one side of the HF terminal or is arranged around at least a part of a circumference of the HF terminal.

5. The HF terminal of claim 1, wherein the HF terminal is a straight, solid cylinder apart from an insertion region of the electromechanical contact section, the HF compensation region, and the electromechanical connection section.

6. The HF terminal of claim 1, wherein a cross-section of the HF compensation region is a protuberance in a center section of the HF terminal, the protuberance has at least a partially constant diameter in the longitudinal direction of the HF terminal and has at least a partial bevel in the longitudinal direction.

7. The HF terminal of claim 1, wherein a dimension of the HF compensation region is larger for higher frequencies.

8. The HF terminal of claim 1, wherein the HF terminal can only be plugged in and not screwed.

9. The HF terminal of claim 1, wherein the HF compensation region is integrally formed with the HF terminal.

10. The HF terminal of claim 1, wherein the HF terminal includes a central axis extending only linearly in the longitudinal direction between a first end defined in the electromechanical contact section and a second end defined in the electromechanical connection section.

11. The HF terminal of claim 1, wherein the HF compensation region is a protuberance defined in the mechanical fastening section, and at least a first portion of the protuberance increases in diameter in a direction toward the electromechanical contact section.

12. The HF terminal of claim 11, wherein at least the first portion of the protuberance linearly increases in diameter in the direction toward the electromechanical contact section.

13. The HF terminal of claim 12, wherein the protuberance linearly increases in diameter over its entire length.

14. The HF terminal of claim 12, wherein the HF compensation region further includes a second portion having a constant diameter, the second portion defined on a side of the first portion proximate the electromechanical contact section and opposite the electromechanical connection section and extends in the direction toward the electromechanical contact section.

15. An HF connector, comprising:
a screen conductor sleeve;
a dielectric material mounted in the screen conductor sleeve; and
a linear HF terminal fastened in the dielectric material; including:
   an electromechanical contact section;
   a mechanical fastening section arranged within the dielectric material;
   an electromechanical connection section; and
   an HF compensation region apart from the electromechanical contact section, the HF compensation region is geometrically shaped in such a way that a loss in a signal integrity of an HF plug-in connector including the HF connector with the HF terminal and an HF mating connector positioned around the HF connector with an HF mating terminal in a final plugged-in position can be at least partially compensated by the HF compensation region, the HF compensation region entirely enclosed by and within the dielectric material.

16. The HF connector of claim 15, wherein the HF compensation region is a protuberance defined in the mechanical fastening section of the HF terminal, and the dielectric material abuts each exterior surface of the HF compensation region.

17. An HF plug-in connector, comprising:
a male HF connector, including:
   a screen conductor sleeve;
   a dielectric material mounted in the screen conductor sleeve; and
   a linear HF terminal fastened in the dielectric material; including:
      an electromechanical contact section;
      a mechanical fastening section arranged within the dielectric material;
      an electromechanical connection section; and
      an HF compensation region apart from the electromechanical contact section, the HF compensation region is geometrically shaped in such a way that a loss in a signal integrity of an HF plug-in connector including the HF connector with the HF terminal and an HF mating connector positioned around the HF connector with an HF mating terminal in a final plugged-in position can be at least partially compensated by the HF compensation region, the HF compensation region embedded within the dielectric material; and
a female HF connector mated with the male HF connector, wherein an air gap is defined between the dielectric material of the male HF connector and a dielectric material of the female HF connector.

18. The HF plug-in connector of claim 17, wherein the HF compensation region is a protuberance formed in the mechanical fastening section and extends at least to the air gap in a direction toward the electromechanical contact section.

19. The HF plug-in connector of claim 17, wherein the HF compensation region is a protuberance formed in the mechanical fastening section, the protuberance including:
a first section having a constant diameter and extending in a longitudinal direction of the HF terminal; and
a second section having an increasing diameter in a direction toward the electromechanical contact section.

20. The HF plug-in connector of claim 17, wherein the dielectric material of the male HF connector abuts each exterior surface of the HF compensation region.

* * * * *